(12) United States Patent
Nikmaram et al.

(10) Patent No.: US 10,356,888 B1
(45) Date of Patent: Jul. 16, 2019

(54) PLASMA GENERATION DEVICE

(71) Applicants: Hamed Nikmaram, Tehran (IR);
Mahmood Ghoranneviss, Tehran (IR);
Nikou Nikmaram, Hannover (DE)

(72) Inventors: Hamed Nikmaram, Tehran (IR);
Mahmood Ghoranneviss, Tehran (IR);
Nikou Nikmaram, Hannover (DE)

(73) Assignee: Hamed Nikmaram, Tehran (IR)

( * ) Notice: Subject to any disclaimer, the term of this patent is extended or adjusted under 35 U.S.C. 154(b) by 0 days.

(21) Appl. No.: 16/199,156

(22) Filed: Nov. 24, 2018

(51) Int. Cl.
| | | |
|---|---|---|
| *H01J 7/24* | (2006.01) | |
| *H05B 31/26* | (2006.01) | |
| *H05H 1/46* | (2006.01) | |
| *H01J 37/32* | (2006.01) | |

(52) U.S. Cl.
CPC ......... *H05H 1/46* (2013.01); *H01J 37/32357* (2013.01); *H01J 2237/327* (2013.01); *H05H 2277/10* (2013.01); *H05H 2277/14* (2013.01)

(58) Field of Classification Search
None
See application file for complete search history.

(56) References Cited

U.S. PATENT DOCUMENTS

| | | | | |
|---|---|---|---|---|
| 2012/0187841 A1* | 7/2012 | Kindel | ................ | A61B 18/042 315/111.21 |
| 2014/0110375 A1* | 4/2014 | Kobayashi | ............... | H05H 1/46 216/67 |

* cited by examiner

*Primary Examiner* — Anh Q Tran

(57) ABSTRACT

A plasma generation device and/or a plurality of plasma generation modules are provided. Responsive to a first plasma generation module of the plurality of plasma generation modules being attached to the plasma generation device, the plasma generation device is configured to supply a first voltage to a first electrode of the first plasma generation module and conduct process gas from a tank to the first plasma generation module in order to generate a first type of plasma at the first plasma generation module. Alternatively and/or additionally, responsive to a second plasma generation module of the plurality of plasma generation modules being attached to the plasma generation device, the plasma generation device is configured to supply a second voltage to a second electrode of the second plasma generation module in order to generate a second type of plasma at the second plasma generation module.

20 Claims, 5 Drawing Sheets

PLASMA GENERATION DEVICE

BACKGROUND

Plasma generation devices may be used for various purposes. For example, plasma generation devices may be used to perform tasks in medical applications (e.g., for rehabilitating wounds, for inhibiting loss of blood from a person, for rashes and/or acne, for removing wrinkles on skin, for providing dental services, etc.) and/or in industrial applications (e.g., for modifying characteristics of surfaces, such as surface adhesion, etc.). However, the tasks may require different types of plasma generation devices. Thus, in order to perform more than one of the tasks, a person may need more than one plasma generation device.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

In an example, a plasma generation device is provided. For example, the plasma generation device may comprise a controller configured to regulate electricity supplied to a terminal of the plasma generation device. Responsive to a first plasma generation module of a plurality of plasma generation modules being attached to a first part of the plasma generation device, the plasma generation device is configured to use the controller to supply a first voltage associated with a first frequency to a first electrode, of the first plasma generation module, connected to the terminal and/or to conduct process gas from a tank to the first plasma generation module in order to generate a first type of plasma at the first plasma generation module. Alternatively and/or additionally, responsive to a second plasma generation module of the plurality of plasma generation modules being attached to the first part of the plasma generation device, the plasma generation device is configured to use the controller to supply a second voltage associated with a second frequency to a second electrode, of the second plasma generation module, connected to the terminal, in order to generate a second type of plasma at the second plasma generation module.

In an example, a method for generating plasma using a plasma generation device is provided. For example, responsive to a first plasma generation module of a plurality of plasma generation modules being attached to a first part of the plasma generation device, a first voltage, associated with a first frequency, may be supplied to a first electrode of the first plasma generation module and process gas may be conducted from a tank to the first plasma generation module in order to generate a first type of plasma at the first plasma generation module. Alternatively and/or additionally, responsive to a second plasma generation module of the plurality of plasma generation modules being attached to the first part of the plasma generation device, a second voltage, associated with a second frequency, may be supplied to a second electrode of the second plasma generation module in order to generate a second type of plasma at the second plasma generation module.

In an example, a plasma generation device is provided. For example, the plasma generation device may comprise a controller configured to regulate electricity supplied to a terminal of the plasma generation device. The plasma generation device may comprise a plurality of sets of terminals. Each set of terminals of the plurality of sets of terminals may correspond to a plasma generation module of a plurality of plasma generation modules. The plurality of sets of terminals may comprise a first set of terminals corresponding to a first plasma generation module. The first plasma generation module may comprise a first conductor positioned such that the first plasma generation module being attached to a first part of the plasma generation device causes a first connection between the first set of terminals. Responsive to the first connection, the controller is used to supply a first voltage associated with a first frequency to a first electrode, of the first plasma generation module, connected to the terminal. The plurality of sets of terminals may comprise a second set of terminals corresponding to a second plasma generation module. The second plasma generation module may comprise a second conductor positioned such that the second plasma generation module being attached to the first part of the plasma generation device causes a second connection between the second set of terminals. Responsive to the second connection, the controller may be used to supply a second voltage associated with a second frequency to a second electrode, of the second plasma generation module, connected to the terminal.

DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

DETAILED DESCRIPTION

Subject matter will now be described more fully hereinafter with reference to the accompanying drawings, which form a part hereof, and which show, by way of illustration, specific example embodiments. This description is not intended as an extensive or detailed discussion of known concepts. Details that are known generally to those of ordinary skill in the relevant art may have been omitted, or may be handled in summary fashion.

The following subject matter may be embodied in a variety of different forms, such as methods, devices, components, and/or systems. Accordingly, this subject matter is not intended to be construed as limited to any example embodiments set forth herein. Rather, example embodiments are provided merely to be illustrative. Such embodiments may, for example, take the form of mechanical devices, electro-mechanical devices, electrical devices or any combination thereof.

Figure 1A:
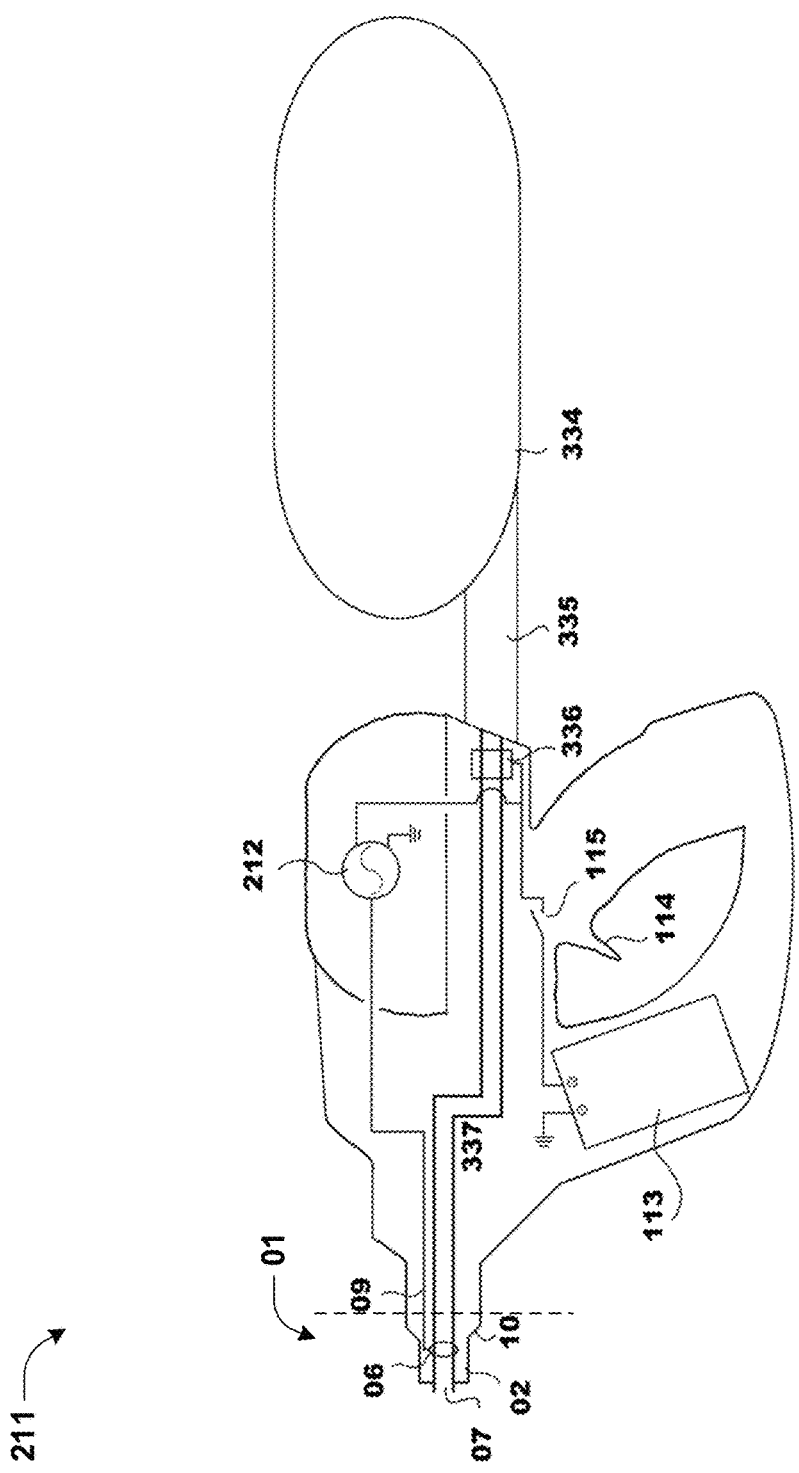
FIG. 1A is a component block diagram illustrating an exemplary plasma generation device

FIG. 1A presents a plasma generation device 211. For example, the plasma generation device 211 may be used in medical applications (e.g., for rehabilitating wounds, for inhibiting loss of blood from a person, for rashes and/or acne, for removing wrinkles on skin, for providing dental services, etc.). Alternatively and/or additionally, the plasma generation device 211 may be used in industrial applications (e.g., for modifying characteristics of surfaces, such as surface adhesion, for dividing objects, etc.).

The plasma generation device 211 may comprise a controller 212 configured to regulate electricity supplied to a terminal 06 of the plasma generation device 211 (e.g., electricity may be supplied to the terminal 06 via a wire 09 and/or a different type of conductor). For example, the controller 212 may comprise a voltage controller. Alternatively and/or additionally, the controller 212 may comprise a voltage regulator. Alternatively and/or additionally, the controller 212 may comprise a different type of controller configured to output electricity having specific voltage characteristics (e.g., voltage levels, voltage frequencies, etc.). Alternatively and/or additionally, the controller 212 may comprise a computer (e.g., a microcontroller, an integrated circuit, etc.) to perform operations. In some examples, the controller 212 may receive power from a portable power source 113 (e.g., a high-voltage power supply, a battery, etc.). For example, the portable power source 113 may comprise an alternating current (AC) battery (e.g., a battery connected to a bi-directional inverter) and/or a direct current (DC) battery.

Alternatively and/or additionally, the plasma generation device 211 may not comprise the portable power source 113. For example, the controller 212 may receive power from an external power source (e.g., an AC network, an external battery, etc.) via one or more connecters (e.g., a power port, a plug, an outlet, etc.). Alternatively and/or additionally, the controller 212 may comprise the portable power source 113 and/or may receive power from the external power source. For example, responsive to a determination that the external power source is not connected to the plasma generation device 211, the controller 212 may receive power from the portable power source 113 (e.g., the portable power source 113 may be used as a backup power source). For example, the external power source may be used for applications where the external power source is available and/or the portable power source 211 may be used for applications (e.g., emergency applications) where the external power source is unavailable.

In some examples, the plasma generation device 211 may comprise a tank 334 (e.g., a pneumatic tank). For example, the plasma generation device 211 may be a portable plasma generation device. For example, the tank 334 may store process gas for use in generating plasma. Alternatively and/or additionally, the plasma generation device 211 may not comprise the tank 334. For example, the process gas may be received from an external tank. Alternatively and/or additionally, responsive to a determination that the external tank is not available, the process gas may be received from the tank 334. For example, the external tank may be used for applications where the external tank is available and/or the tank 334 may be used for applications (e.g., emergency applications) where the external tank is unavailable. In some examples, the process gas may comprise one or more gasses, such as one or more of helium, argon, oxygen, nitrogen, etc. (e.g., the process gas may comprise low levels of oxygen and/or nitrogen and/or the process gas may not comprise oxygen and/or nitrogen).

In some examples, the plasma generation device 211 may comprise a first passage 335 configured to conduct the process gas from the tank 334 to a control valve 336. For example, the control valve 336 may comprise a gas control valve configured to conduct the process gas from the first passage 335 to an outlet 07 of the plasma generation device 211. For example, the process gas may be conducted from the first passage 335 to the outlet 07 when a type of plasma is being generated that requires the process gas to be generated. In some examples, the process gas may be conducted from the first passage 335 to the outlet 07 using a second passage 337.

Alternatively and/or additionally, the control valve 336 may be configured to regulate flow of the process gas from the first passage 335 (e.g., from the tank 334 and/or the external tank) to the outlet 07. For example, a size of flow passage of the control valve 336 may be set manually (e.g., using a set of buttons, using a dial, etc. of the plasma generation device 211). Alternatively and/or additionally, the size of flow passage of the first flow control valve 212 may be set automatically.

In some examples, the plasma generation device 211 may comprise an activation switch 115. For example, the activation switch 115 may be controlled by a trigger 114 of the plasma generation device 211. For example, the trigger 114 may be designed for convenience of a user of the plasma generation device 211 such that the user may easily control the plasma generation device 211 (e.g., the plasma generation device 211 may be a handheld plasma generation device). Alternatively and/or additionally, the activation switch 115 may be controlled by a button, a switch, etc. of the plasma generation device 211. In some examples, responsive to activation of the switch 115, the plasma generation device 211 may become activated. For example, responsive to the plasma generation device 211 becoming activated, the controller 212 may supply electricity to the terminal 06. Alternatively and/or additionally, responsive to the plasma generation device 211 becoming activated, the control valve 336 may conduct the process gas from the first passage 335 (and/or from the tank 334) to the outlet 07.

Figure 1B:
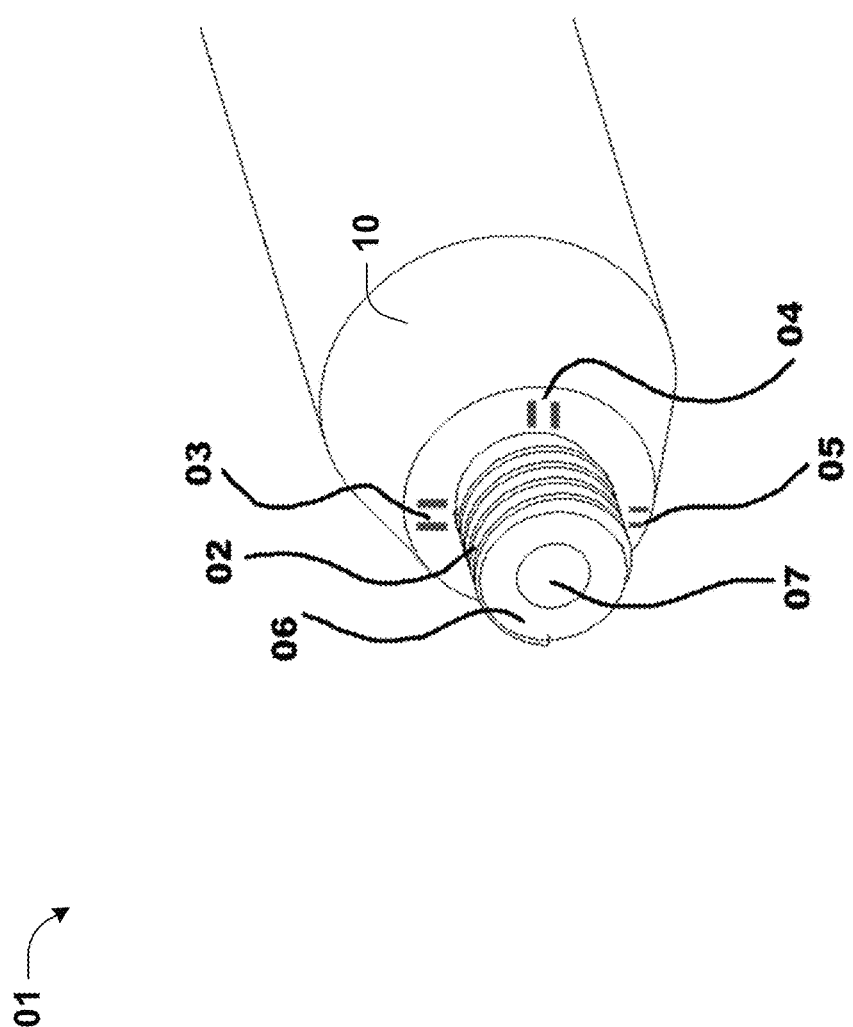
FIG. 1B is a component block diagram illustrating a first part of an exemplary plasma generation device.
Figure 2:
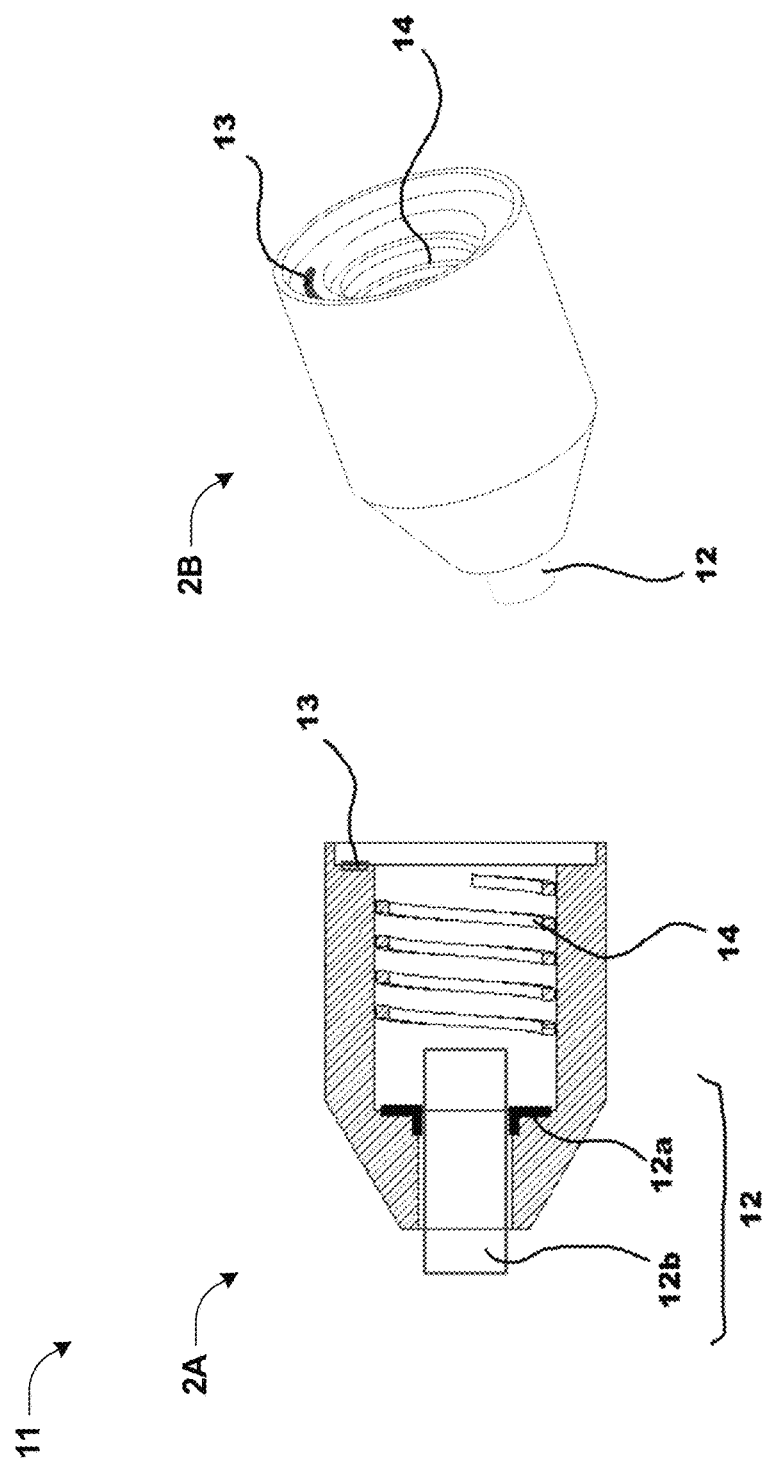
FIG. 2 is a component block diagram illustrating a cross-sectional representation and a second representation of an exemplary plasma generation module.
Figure 3:
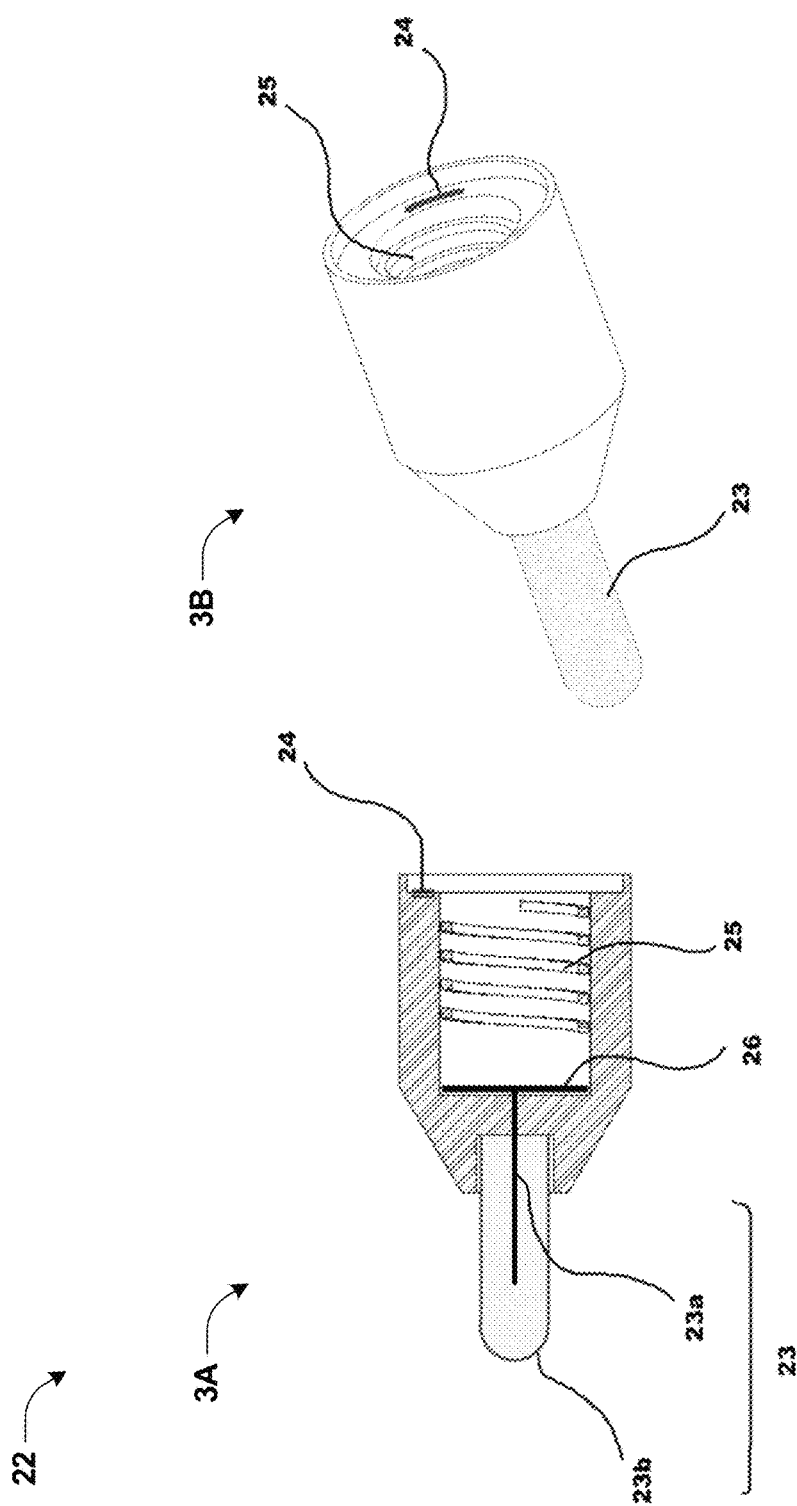
FIG. 3 is a component block diagram illustrating a cross-sectional representation and a second representation of an exemplary plasma generation module.
Figure 4:
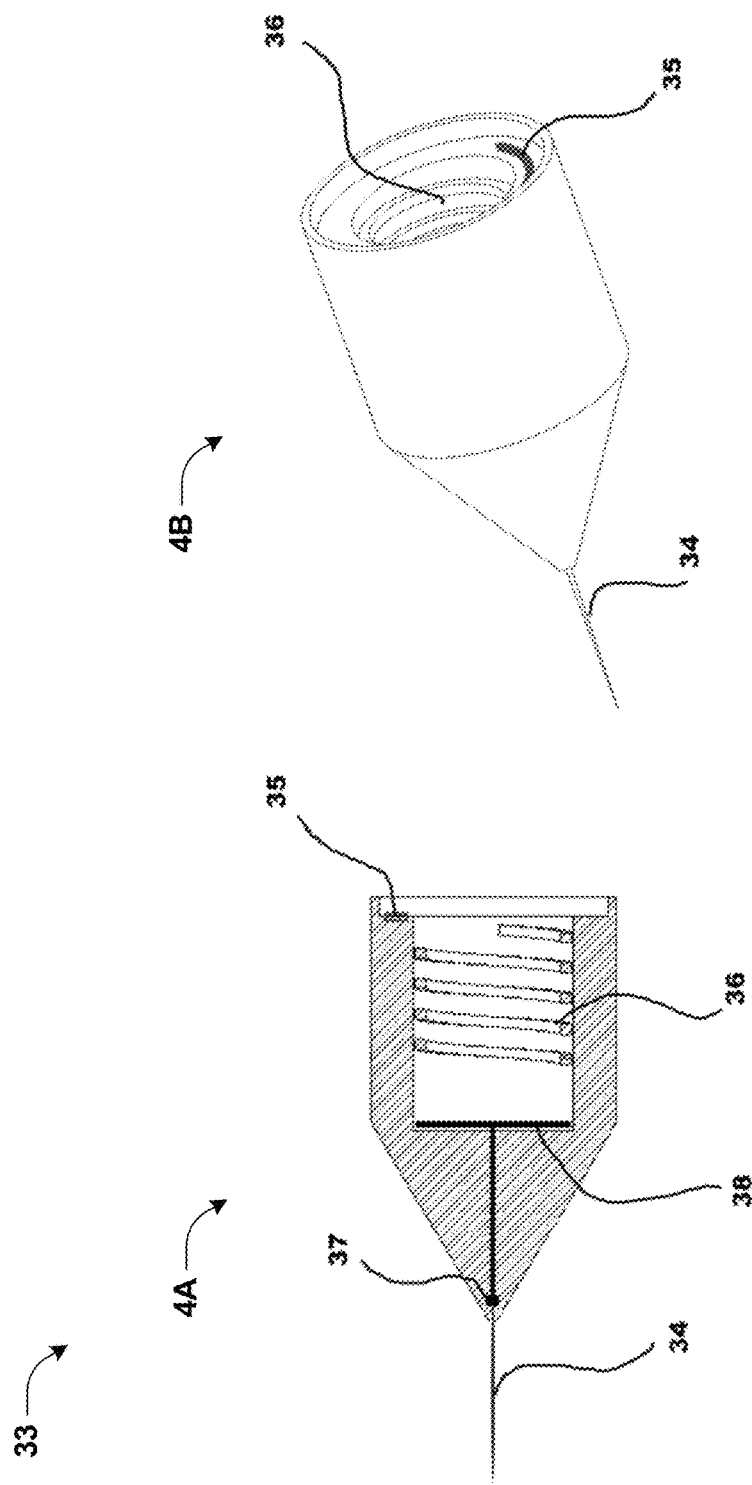
FIG. 4 is a component block diagram illustrating a cross-sectional representation and a second representation of an exemplary plasma generation module.

FIG. 1B presents a first part 01 of the plasma generation device 211. In some examples, the first part 01 of the plasma generation device 211 may comprise the terminal 06. The first part 01 of the plasma generation device 211 may be configured such that a plurality of plasma generation modules (e.g., plasma generation applicators) (examples of which are illustrated in FIGS. 2-4) may be attached to the first part 01 of the plasma generation device 211. For example, the plurality of plasma generation modules may be fastened to the first part 01 of the plasma generation device 211 (separately). Alternatively and/or additionally, a plasma generation module may be attached to the first part 01 of the plasma generation device 211 such that a portion of the plasma generation module may be coupled to a surface 10 of the first part 01 of the plasma generation device 211.

For example, the first part 01 of the plasma generation device 211 may comprise a set of threads 02 (e.g., continuous threads). The set of threads 02 may be used for attaching (e.g., fastening, coupling, connecting) the first part 01 of the plasma generation device 211 to the plurality of plasma generation modules. Alternatively and/or additionally, the plasma generation device 211 may comprise one or more clasps used for attaching the first part 01 of the plasma generation device 211 to the plurality of plasma generation modules. For example, rather than the first part 01 of the plasma generation device 211 comprising the set of threads 02 to attach a plasma generation module to the first part 01 the plasma generation device 211, the one or more clasps may be used for attaching the plasma generation module to the first part 01 of the plasma generation device 211. Alternatively and/or additionally, in addition to the first part 01 of the plasma generation device 211 comprising the set of threads 02 to attach a plasma generation module to the first part 01 the plasma generation device 211, the one or more clasps may be used for attaching the plasma generation module to the first part 01 of the plasma generation device 211 for further securing the plasma generation module to the first part 01 of the plasma generation device 211. It may be appreciated that various embodiments having different structures for attachment of plasma generation modules to the plasma generation device 211 may be contemplated and are not limited to threads and/or clasps.

In some examples, the first part 01 of the plasma generation device 211 may comprise a plurality of sets of terminals. For example, the plurality of sets of terminals may comprise a first set of terminals 03 corresponding to a first plasma generation module 11 (e.g., illustrated in FIG. 2) of the plurality of plasma generation modules. Alternatively and/or additionally, the plurality of sets of terminals may comprise a second set of terminals 04 corresponding to a second plasma generation module 22 (e.g., illustrated in FIG. 3) of the plurality of plasma generation modules. Alternatively and/or additionally, the plurality of sets of terminals may comprise a third set of terminals 05 corresponding to a third plasma generation module 33 (e.g., illustrated in FIG. 4) of the plurality of plasma generation modules.

In some examples, each plasma generation module of the plurality of plasma generation modules may be associated with a type of plasma of a plurality of types of plasma. In some examples, the plurality of types of plasma may comprise a plasma jet, a dielectric barrier discharge (DBD) plasma, a floating electrode dielectric barrier discharge (FEDBD) plasma, an electrical discharge plasma, a corona discharge plasma, a gliding arch plasma and/or a plasma torch.

For example, the first plasma generation module 11 may be associated with a first type of plasma. For example, the first plasma generation module 11 may be attached to the first part 01 of the plasma generation device 211 in order to generate the first type of plasma. Alternatively and/or additionally, the second plasma generation module 22 may be associated with a second type of plasma. For example, the second plasma generation module 22 may be attached to the first part 01 of the plasma generation device 211 in order to generate the second type of plasma. Alternatively and/or additionally, the third plasma generation module 33 may be associated with a third type of plasma. For example, the third plasma generation module 33 may be attached to the first part 01 of the plasma generation device 211 in order to generate the third type of plasma.

In some examples, each plasma generation module of the plurality of plasma generation modules may be associated with a set of requirements in order to generate a type of plasma associated with the plasma generation module. For example, sets of requirements associated with the plurality of plasma generation modules may be different from each other. For example, a plasma jet, a plasma torch and/or a gliding arc plasma may require the process gas in order to be generated. Alternatively and/or additionally, a DBD plasma, an FEDBD plasma, an electrical discharge plasma and/or a corona discharge plasma may not require the process gas in order to be generated. Alternatively and/or additionally, plurality of types of plasma may require different voltages and/or frequencies in order to be generated.

For example, in order to generate the first type of plasma, the first plasma generation module 11 may require a first voltage associated with a first frequency and/or may require the process gas. Alternatively and/or additionally, in order to generate the second type of plasma, the second plasma generation module 22 may require a second voltage associated with a second frequency and/or may not require the process gas. Alternatively and/or additionally, in order to generate the third type of plasma, the third plasma generation module 33 may require a third voltage associated with a third frequency and/or may not require the process gas.

Accordingly, it may be necessary for the plasma generation device 211 to operate in accordance with a set of requirements of a plasma generation module that is attached to it and/or a type of plasma associated with the plasma generation module. Further, it may be necessary for the plasma generation device 211 to distinguish between the plurality of plasma generation modules. For example, the first plasma generation module 11 may comprise a first conductor 13 (illustrated in FIG. 2) which is positioned such that when the first plasma generation module 11 is attached to the first part 01 of the plasma generation device 211, a first connection is established between the first set of terminals 03. Alternatively and/or additionally, the second plasma generation module 22 may comprise a second conductor 24 (illustrated in FIG. 3) which is positioned such that when the second plasma generation module 22 is attached to the first part 01 of the plasma generation device 211, a second connection is established between the second set of terminals 04. Alternatively and/or additionally, the third plasma generation module 33 may comprise a third conductor 35 (illustrated in FIG. 4) which is positioned such that when the third plasma generation module 33 is attached to the first part 01 of the plasma generation device 211, a third connection is established between the third set of terminals 05.

In some examples, each set of terminals of the plurality of sets of terminals may correspond to a circuit of a plurality of circuits. For example, the first set of terminals 03 may correspond to a first circuit. The first circuit may be an open circuit which may be closed by the first connection. In some examples, the first circuit being closed may cause the first voltage associated with the first frequency to be supplied to the terminal 06 and/or the process gas to be conducted to the outlet 07. Alternatively and/or additionally, the second set of terminals 04 may correspond to a second circuit. The second circuit may be an open circuit which may be closed by the second connection. In some examples, the second circuit being closed may cause the second voltage associated with the second frequency to be supplied to the terminal 06. Alternatively and/or additionally, the third set of terminals 05 may correspond to a third circuit. The third circuit may be an open circuit which may be closed by the third connection. In some examples, the third circuit being closed may cause the third voltage associated with the third frequency to be supplied to the terminal 06.

Rather than using the plurality of sets of terminals to distinguish between the plurality of plasma generation modules, the plasma generation device 211 may comprise one or more sensors. For example, the one or more sensors may detect a type of plasma generation module attached to the first part 01 of the plasma generation device 211. For example, each plasma generation module of the plurality of plasma generation modules may comprise an identification device, such as a tag (e.g., a radio-frequency identification (RFID) tag), an electronic tagging device, etc.). Alternatively and/or additionally, an identification code and/or barcode may be attached to each plasma generation module of the plurality of plasma generation modules.

The one or more sensors may detect which plasma generation module of the plurality of plasma generation modules is attached to the first part 01 of the plasma generation device 211 (e.g., by detecting a tag, by scanning and/or detecting an identification code and/or a barcode, etc.). In some examples, responsive to detecting a plasma generation module attached to the first part 01 of the plasma generation device 211, a signal indicative of the plasma generation module may be transmitted by the one or more sensors to the controller 212 and/or the control valve 336.

For example, responsive to detecting that the first plasma generation module 11 is attached to the first part 01 of the plasma generation device 211, a first signal, indicative of the first plasma generation module 11, may be transmitted to the controller 212 and/or to the control valve 336. In some examples, responsive to the first signal being transmitted to the controller 212 and/or to the control valve 336, the controller 212 may supply the first voltage to the terminal 06 and/or control valve 336 may conduct the process gas from the tank 334 to the outlet 07.

Alternatively and/or additionally, responsive to detecting that the second plasma generation module 22 is attached to the first part 01 of the plasma generation device 211, a second signal, indicative of the second plasma generation module 22, may be transmitted to the controller 212. In some examples, responsive to the second signal being transmitted to the controller 212, the controller 212 may supply the second voltage to the terminal 06. Alternatively and/or additionally, responsive to detecting that the third plasma generation module 33 is attached to the first part 01 of the plasma generation device 211, a third signal, indicative of the third plasma generation module 33, may be transmitted to the controller 212. In some examples, responsive to the third signal being transmitted to the controller 212, the controller 212 may supply the third voltage to the terminal 06.

It may be appreciated that various embodiments may be contemplated and are not limited to the plurality of plasma generation modules comprising three plasma generation modules. For example, the plurality of plasma generation modules may comprise two plasma generation modules, more than three plasma generation modules, etc., wherein the plurality of sets of terminals may have a number of sets of terminals and/or may be positioned based upon a number of plasma generation modules of the plurality of plasma generation modules.

FIG. 2 presents a cross-sectional representation 2A of the first plasma generation module 11 and a second representation 2B of the first plasma generation module 11. For example, the first plasma generation module 11 may comprise a second set of threads 14 (e.g., continuous threads) which may be used for attaching the first plasma generation module 11 to the first part 01 of the plasma generation device 211. Alternatively and/or additionally, the first plasma generation module 11 may comprise the first conductor 13 which may establish the first connection between the first set of terminals 03 when the first plasma generation module 11 is attached to the first part 01 of the plasma generation device 211.

In some examples, the first plasma generation module 11 may comprise a second outlet 12b which may be used to output the first type of plasma. Alternatively and/or additionally, the first plasma generation module may comprise a first electrode 12a. For example, the first electrode 12a may be positioned such that when the first plasma generation module 11 is attached to the first part 01 of the plasma generation device 211, the terminal 06 is connected to the first electrode 12a.

In some examples, the first type of plasma may be a non-thermal plasma (e.g., cold plasma, non-equilibrium plasma). For example, the first type of plasma may be a non-local thermal equilibrium (LTE) plasma (e.g., wherein a temperature of ions and/or neutral species of the non-LTE plasma may be less than 100° Celsius). Alternatively and/or additionally, the first type of plasma may be a plasma jet. For example, responsive to the first plasma generation module 11 being attached to the first part 01 of the plasma generation device 211, the first voltage associated with the first frequency may be supplied to the first electrode 12a (via the terminal 06). Alternatively and/or additionally, the process gas may be conducted to the second outlet 12b (via the outlet 07). For example, the first voltage and/or the first frequency of the first voltage may be configured such that the plasma jet is generated at the first plasma generation module 11 and/or outputted by the second outlet 12b. Alternatively and/or additionally, the plasma jet may be controlled by controlling the first voltage, the first frequency and/or flow of the process gas conducted from the tank 334 to the second outlet 12b.

FIG. 3 presents a cross-sectional representation 3A of the second plasma generation module 22 and a second representation 3B of the second plasma generation module 22. For example, the second plasma generation module 22 may comprise a third set of threads 25 (e.g., continuous threads) which may be used for attaching the second plasma generation module 22 to the first part 01 of the plasma generation device 211. Alternatively and/or additionally, the second plasma generation module 22 may comprise the second conductor 24 which may establish the second connection between the second set of terminals 04 when the second plasma generation module 22 is attached to the first part 01 of the plasma generation device 211.

In some examples, the second plasma generation module 22 may comprise a second electrode 26. For example, the second electrode 26 may be positioned such that when the second plasma generation module 22 is attached to the first part 01 of the plasma generation device 211, the terminal 06 is connected to the second electrode 26. For example, the second plasma generation module 22 may comprise an enclosure 23b which may enclose a portion 23a of the second electrode 26. For example, the enclosure 23b may surround the portion 23a of the second electrode 26. In some examples, the enclosure 23b may be made of a dielectric material. For example, the enclosure 23b may be made of glass. Alternatively and/or additionally, the enclosure 23b may be made of a different dielectric material (e.g., mica).

In some examples, the second type of plasma may be a second non-thermal plasma. For example, the second type of plasma may be a second non-LTE plasma. Alternatively and/or additionally, the second type of plasma may be a DBD plasma (e.g., an FEDBD plasma). For example, responsive to the second plasma generation module 22 being attached to the first part 01 of the plasma generation device 211, the second voltage associated with the second frequency may be supplied to the second electrode 26 (via the terminal 06) which may cause the DBD plasma to be generated. For example, the second voltage and/or the second frequency of the second voltage may be configured such that the DBD plasma is generated at the second plasma generation module 22. In some examples, the DBD plasma may be generated adjacent to the enclosure 23b (e.g., the DBD plasma may be generated beside the enclosure 23b and/or at an area adjoining and/or connected to the enclosure 23b). Alternatively and/or additionally, the DBD plasma may be controlled by controlling the second voltage and/or the second frequency.

FIG. 4 presents a cross-sectional representation 4A of the third plasma generation module 33 and a second representation 4B of the third plasma generation module 33. For example, the third plasma generation module 33 may comprise a third set of threads 36 (e.g., continuous threads) which may be used for attaching the third plasma generation module 33 to the first part 01 of the plasma generation device 211. Alternatively and/or additionally, the third plasma generation module 33 may comprise the third conductor 35 which may establish the third connection between the third set of terminals 05 when the third plasma generation module 33 is attached to the first part 01 of the plasma generation device 211.

In some examples, the third plasma generation module 33 may comprise a third electrode 38. For example, the third electrode 38 may be positioned such that when the third plasma generation module 33 is attached to the first part 01 of the plasma generation device 211, the terminal 06 is connected to the third electrode 38. For example, the second plasma generation module 22 may comprise a plasma needle 34 (e.g., a conductor) which may be connected to the third electrode 38. For example, the plasma needle 38 may be attached to the third electrode 38 using a mount 37.

In some examples, the third type of plasma may be a thermal plasma (e.g., a thermal equilibrium plasma). For example, the third type of plasma may be an LTE plasma (e.g., wherein temperatures of electrons, ions and/or neutral species of the LTE plasma are equal and/or approximately equal to each other). Alternatively and/or additionally, the third type of plasma may be an electrical discharge plasma (e.g., a spark plasma). For example, responsive to the third plasma generation module 33 being attached to the first part 01 of the plasma generation device 211, the third voltage associated with the third frequency may be supplied to the third electrode 38 (via the terminal 06) which may cause the electrical discharge plasma to be generated. For example, the third voltage and/or the third frequency of the third voltage may be configured such that the electrical discharge plasma is generated at the third plasma generation module 33. In some examples, the electrical discharge plasma may be generated adjacent to the plasma needle 34 (e.g., the electrical discharge plasma may be generated beside the plasma needle 34 and/or at an area adjoining and/or connected to the plasma needle 34). Alternatively and/or additionally, the electrical discharge plasma may be controlled by controlling the third voltage and/or the third frequency.

It may be appreciated that various embodiments may be contemplated and are not limited to merely producing the plasma jet, the DBD plasma (and/or the FEDBD plasma) and/or the electrical discharge plasma. For example, the plasma generation device 211 may be enabled to generate other types of plasma, such as a corona discharge plasma, a gliding arch plasma, a plasma torch, etc. For example, the plasma generation device 211 may be enabled to generate the other types of plasma by employing plasma generation modules associated with the other types of plasma.

It may be appreciated that techniques and/or devices provided herein may enable a portable plasma generation device to have greater power efficiency and/or higher safety than common techniques and/or devices used in portable plasma generation applications, such as existing portable plasma generation devices which may employ radio-frequency (RF) technologies and which have lower power efficiency due to an inductive coupling, leading to higher power consumption and/or higher operating temperatures (which may result in unsafe conditions).

Further benefits include automatically distinguishing between plasma generation modules and/or types of plasma to be generated. This may minimize mistakes made by users of a plasma generation device as settings may not need to be manually inputted using the plasma generation device. Thus, safety associated with the plasma generation device may be increased (e.g., as a result of the plasma generation device detecting a plasma generation module, as a result of the plasma generation device providing a voltage associated with a frequency for generating a type of plasma associated with the plasma generation module, as a result of the plasma generation device providing a process gas to the plasma generation device if required, etc.). For example, errors caused by settings being incorrectly inputted by users may be reduced which may lead to a decrease in accidents and/or an increase in life expectancy of the plasma generation device. Considering that the plasma generation device is frequently used in medical applications, reducing accidents is highly beneficial, both to users handling the plasma generation device, and to patients who may be receiving care using the plasma generation device.

Further benefits include enabling the plasma generation device to be attached to a plurality of plasma generation modules such that, in order to generate various types of plasma, a user merely needs to attach a plasma generation module. Accordingly, costs may be reduced (e.g., as a result of the user using plasma generation modules corresponding to the various types of plasma rather than using separate plasma generation devices for each type of plasma of the various types of plasma).

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments and/or examples are provided herein. The order in which some or all of the operations are described herein should not be construed as to imply that these operations are necessarily order dependent. Alternative ordering will be appreciated by one skilled in the art having the benefit of this description. Further, it will be understood that not all operations are necessarily present in each embodiment and/or example provided herein. Also, it will be understood that not all operations are necessary in some embodiments and/or examples.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A plasma generation device, comprising:
a controller configured to regulate electricity supplied to a terminal of the plasma generation device, wherein:
responsive to a first plasma generation module of a plurality of plasma generation modules being attached to a first part of the plasma generation device, the plasma generation device is configured to:
use the controller to supply a first voltage associated with a first frequency to a first electrode, of the first plasma generation module, connected to the terminal; and
conduct process gas from a tank to the first plasma generation module in order to generate a first type of plasma at the first plasma generation module; and
responsive to a second plasma generation module of the plurality of plasma generation modules being attached to the first part of the plasma generation device, the plasma generation device is configured to use the controller to supply a second voltage associated with a second frequency to a second electrode, of the second plasma generation module, connected to the terminal, in order to generate a second type of plasma at the second plasma generation module.

2. The plasma generation device of claim 1, comprising a plurality of sets of terminals, wherein each set of terminals of the plurality of sets of terminals corresponds to a plasma generation module of the plurality of plasma generation modules, wherein:
the plurality of sets of terminals comprises:
a first set of terminals corresponding to the first plasma generation module; and
a second set of terminals corresponding to the second plasma generation module;
the first plasma generation module comprises a first conductor positioned such that the first plasma generation module being attached to the first part of the plasma generation device causes a first connection between the first set of terminals; and
the second plasma generation module comprises a second conductor positioned such that the second plasma generation module being attached to the first part of the plasma generation device causes a second connection between the second set of terminals.

3. The plasma generation device of claim 2, wherein:
the using the controller to supply the first voltage to the first electrode and the conducting the process gas from the tank to the first plasma generation module are performed responsive to the first connection; and
the using the controller to supply the second voltage to the second electrode is performed responsive to the second connection.

4. The plasma generation device of claim 1, comprising one or more sensors configured to:
responsive to detecting the first plasma generation module being attached to the first part of the plasma generation device, transmit a first signal, indicative of the first plasma generation module, to the controller; and
responsive to detecting the second plasma generation module being attached to the first part of the plasma generation device, transmit a second signal, indicative of the second plasma generation module, to the controller.

5. The plasma generation device of claim 4, wherein:
the using the controller to supply the first voltage to the first electrode and the conducting the process gas from the tank to the first plasma generation module are performed responsive to the first signal being transmitted; and
the using the controller to supply the second voltage associated with the second frequency to the second electrode is performed responsive to the second signal being transmitted.

6. The plasma generation device of claim 1, wherein:
the first type of plasma is a plasma jet;
the first voltage is configured for the plasma jet to be generated at the first plasma generation module; and
the first plasma generation module is configured to output the plasma jet using an outlet of the first plasma generation module.

7. The plasma generation device of claim 6, comprising a gas control valve configured to conduct the process gas from the tank to the first plasma generation module responsive to the first plasma generation module being attached to the first part of the plasma generation device.

8. The plasma generation device of claim 7, wherein the gas control valve is configured to regulate flow of the process gas.

9. The plasma generation device of claim 7, wherein:
the plasma generation device is a portable plasma generation device; and
the tank is comprised within the plasma generation device.

10. The plasma generation device of claim 7, wherein the tank is an external tank connected to the plasma generation device.

11. The plasma generation device of claim 1, wherein:
the second type of plasma is a dielectric barrier discharge (DBD) plasma; and
the second voltage is configured for the DBD plasma to be generated at the second plasma generation module.

12. The plasma generation device of claim 11, wherein:
the second plasma generation module comprises an enclosure enclosing a portion of the second electrode; and
the DBD plasma is generated adjacent to the enclosure.

13. The plasma generation device of claim 12, wherein the enclosure is made of a dielectric material.

14. The plasma generation device of claim 1, wherein:

responsive to a third plasma generation module of the plurality of plasma generation modules being attached to the first part of the plasma generation device, the plasma generation device is configured to use the controller to supply a third voltage associated with a third frequency to a third electrode, of the third plasma generation module, connected to the terminal, in order to generate a third type of plasma at the third plasma generation module.

15. The plasma generation device of claim 14, wherein:

the third type of plasma is an electrical discharge plasma; and the third voltage is configured for the electrical discharge plasma to be generated at the third plasma generation module.

16. The plasma generation device of claim 15, wherein:

the third plasma generation module comprises a plasma needle connected to the third electrode; and the electrical discharge plasma is generated adjacent to the plasma needle.

17. The plasma generation device of claim 1, wherein:

the first type of plasma is a non-thermal plasma; and the second type of plasma is a thermal plasma.

18. A method for generating plasma using a plasma generation device, comprising:

responsive to a first plasma generation module of a plurality of plasma generation modules being attached to a first part of the plasma generation device:

supplying a first voltage associated with a first frequency to a first electrode of the first plasma generation module; and conducting process gas from a tank to the first plasma generation module in order to generate a first type of plasma at the first plasma generation module; and responsive to a second plasma generation module of the plurality of plasma generation modules being attached to the first part of the plasma generation device, supplying a second voltage associated with a second frequency to a second electrode of the second plasma generation module in order to generate a second type of plasma at the second plasma generation module.

19. The method of claim 18, wherein:

the first type of plasma is a non-thermal plasma; and the second type of plasma is a thermal plasma.

20. A plasma generation device, comprising:

a controller configured to regulate electricity supplied to a terminal of the plasma generation device; and a plurality of sets of terminals, wherein each set of terminals of the plurality of sets of terminals corresponds to a plasma generation module of a plurality of plasma generation modules, wherein:

the plurality of sets of terminals comprises a first set of terminals corresponding to a first plasma generation module;

the first plasma generation module comprises a first conductor positioned such that the first plasma generation module being attached to a first part of the plasma generation device causes a first connection between the first set of terminals;

responsive to the first connection, the controller is used to supply a first voltage associated with a first frequency to a first electrode, of the first plasma generation module, connected to the terminal;

the plurality of sets of terminals comprises a second set of terminals corresponding to a second plasma generation module;

the second plasma generation module comprises a second conductor positioned such that the second plasma generation module being attached to the first part of the plasma generation device causes a second connection between the second set of terminals; and responsive to the second connection, the controller is used to supply a second voltage associated with a second frequency to a second electrode, of the second plasma generation module, connected to the terminal.

\* \* \* \* \*